United States Patent [19]
Schultz

[11] Patent Number: 5,184,120
[45] Date of Patent: Feb. 2, 1993

[54] MENU SELECTION USING ADAPTIVE FORCE SENSING RESISTOR

[75] Inventor: Charles P. Schultz, Hialeah, Fla.

[73] Assignee: Motorola, Inc., Schaumburg, Ill.

[21] Appl. No.: 680,474

[22] Filed: Apr. 4, 1991

[51] Int. Cl.$^5$ ............................................ H03M 11/10
[52] U.S. Cl. ........................ 340/870.38; 340/870.04; 340/706; 341/23; 341/34; 455/186.2; 364/709.15
[58] Field of Search ............... 340/870.04, 870.38, 340/706, 711; 341/20, 21, 22, 23, 24; 73/1 R, 1 B, 862.64, 862.62; 455/186.2; 364/558, 709.15; 400/482, 485, 87; 338/114; 250/5 R

[56] References Cited
U.S. PATENT DOCUMENTS

| | | | |
|---|---|---|---|
| 4,374,425 | 2/1983 | Fuka | 364/709.15 |
| 4,670,747 | 6/1987 | Borras et al. | 340/825.56 |
| 4,673,919 | 6/1987 | Kataoka | 341/34 |
| 4,739,299 | 4/1988 | Eventoff et al. | 338/99 |
| 4,810,992 | 3/1989 | Eventoff | 338/99 |
| 4,818,194 | 3/1989 | Andros, Jr. | 455/154 |
| 4,963,702 | 10/1990 | Yaniger et al. | 178/18 |
| 5,063,376 | 4/1991 | Chang | 341/34 |

Primary Examiner—Donald J. Yusko
Assistant Examiner—Michael Horabik
Attorney, Agent, or Firm—Juliana Agon

[57] ABSTRACT

A method of menu selection is provided. An applied range of force by a user on a force sensitive resistor (112) selector key is calibrated (300) to a selective range of force for selecting a range of menu items. A variable press by that user is then associated (110) to a selection of a menu item.

9 Claims, 5 Drawing Sheets

FIG.2

| MENU ENTRY | DISPLAYABLE CHARACTER SET |
|---|---|
| A/D RANGE | MENU ITEM |
| $FFFF–E000 | NO SELECTION |
| $DFFF–$C000 | CALL ALERT |
| $BFFF–$A000 | PRIVATE CALL |
| ⋮ | ⋮ |
| $7FFF–$4000 | STATUS |
| $3FFF–$2000 | PHONE |
| $1FFF–$0000 | ZONE/CHAN |

(UNPRESSED)

MENU SELECTION USING ADAPTIVE FORCE SENSING RESISTOR

TECHNICAL FIELD

This invention relates to the field of portable two-way radios, paging receivers, or any other communication devices having menu selection and specifically relates to a method and means of selecting a menu item by applying a variable force to a force sensing resistor.

BACKGROUND

The recent trend in the design of communication devices or portable radios, such as hand held transceivers and selective call paging receivers has been to reduce the overall size of the radio and to add more functions and options. When more functions are added, however, additional controls must be provided to permit the user to select a particular operating parameter. But adding controls conflicts with the trend towards smaller radios, since there is less space available to add additional switches and other control devices.

Conventionally, the user's time to activate a menu or variable function parameter selection is saved by dividing the various functions, modes, or parameter features among multiple menu keys. The quickest and most convenient way to select a particular function would be to use an individual key for each system operation, mode, parameter, or feature. This approach however has the disadvantage that it requires many keys and therefore a large area to be implemented. In portable two-way units or paging receivers "real estate" is at a premium.

To increase the number of selectable functions, while reducing the number of switches, a radio controller or microcomputer could be designed to include a menu of possible function parameters that could be selected by scrolling or sequentially stepping through the menu by the selector's activation of one or more switches. Initially, a "menu" switch could be scrolled to select the menu item. Then another switch would scroll "up" (i.e. from the last entry in the menu toward the first) while a third switch would scroll "down" from the first entry towards the last. A display could be positioned on the top or elsewhere of the radio to indicate the particular parameter selected.

However, as market demands strive for the development of radios with more features and modes of operation for a user to select from, it will take much longer for the desired or selected feature or mode of operation to be reached by scrolling, since many undesired features or modes will have to be traversed first.

Therefore a need arises to provide a convenient method while saving real estate for the selection of features, functions, or modes using a minimum of keys. In addition, less keys present would also enable single-hand menu selection, which may be beneficial to a handicapped person or machine operator.

SUMMARY OF THE INVENTION

Accordingly, it is an object of the present invention to provide a force sensing resistor (FSR) as a selector key, such that any menu item can be selected by a single press of the FSR selector.

Briefly, according to the invention, a method of menu selection calibrates a range of force applied by a user on a force sensitive resistor selector key to a selective range of force required for selecting a range of menu items and associates a variable press by that user to a selection of a menu item.

BRIEF DESCRIPTION OF THE DRAWINGS

FIG. 2 is a symbolic representation of the possible assignments of input voltage ranges read by an A/D circuit for menu selections of radio functions.

DETAILED DESCRIPTION OF THE PREFERRED EMBODIMENT

Figure 1:
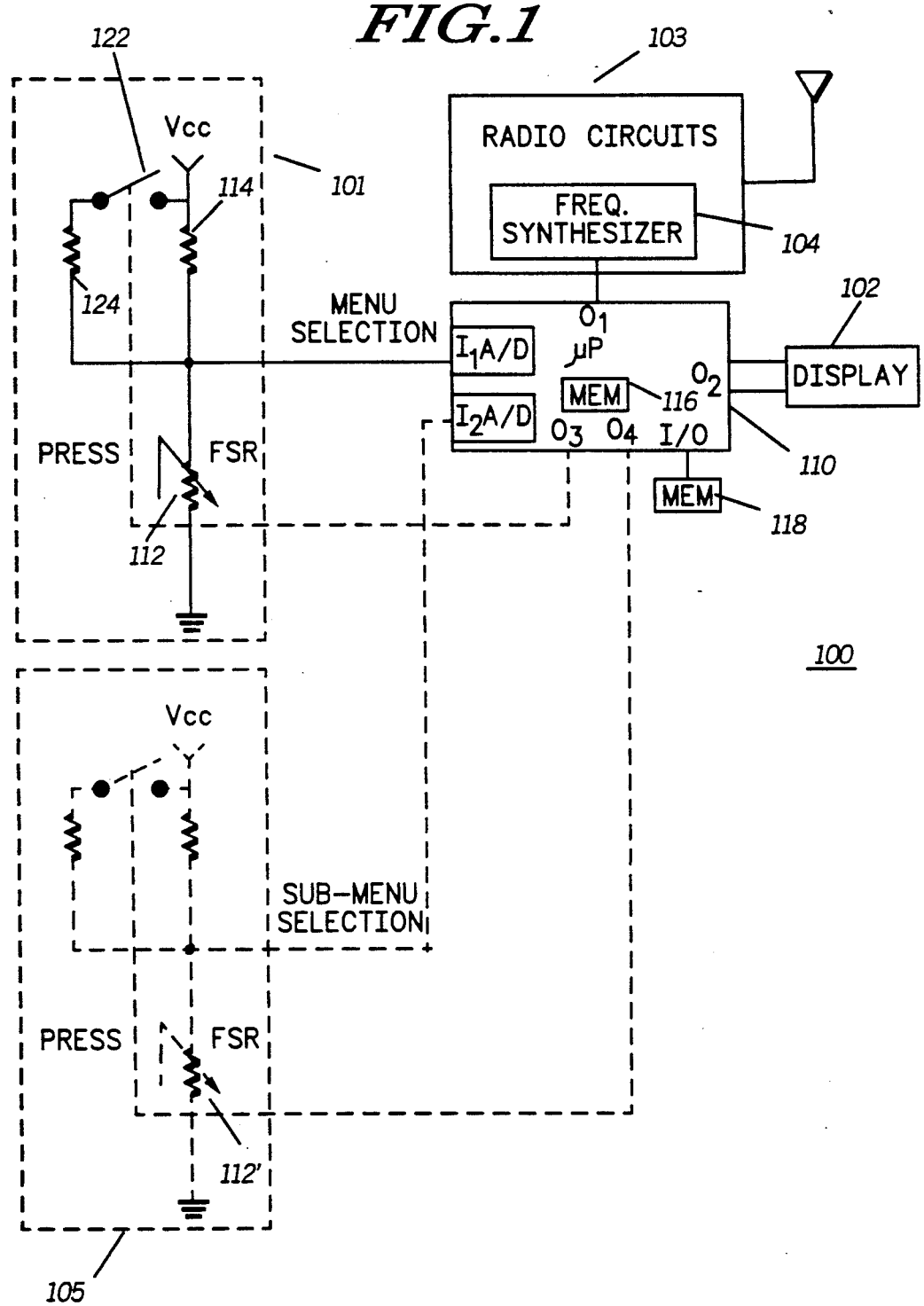
FIG. 1 is a block diagram of the present invention.

Referring to FIG. 1, a radio 100 having a selector or menu key 112 and a display 102 which are used to implement the menu entry system of the present invention is illustrated. The display 102 is coupled to a controller, microcomputer, or microprocessor 110 through a multi-line data connection and may optionally include a display driver. Preferably, the microcomputer 110 is a processor with ROM, RAM, input/output ports, timer capabilities, and display drivers such as liquid crystal display (LCD) drivers all in a single chip. An internal memory 116 includes random access (RAM) and read only (ROM) memory and an external memory 118 may include electrically erasable/programmable read only memory (EEPROM) integrated circuits and EPROM. A menu of variable radio function parameters and the characteristics of those functions such as frequencies or identification numbers (IDs) forming sub-menus and their corresponding displayable character sets (more specifically, codes that represent these functions or characteristics and their characters) is programmed in the external memory 118 as entries and/or sub-entries.

Information generated and displayed by the menu key/display is communicated to a radio circuit 103 that includes a well-known frequency synthesizer 104. The output $O_2$ of the microcomputer 110 includes lines for data and clock signals which load character codes into the display driver or display 102. The ROM in the memory 116 has been programmed to handle the LCD display 102, read the menu key 112, operate the I/O ports and to encode and interpret the data information received from or communicated to the radio circuits 103.

On the other hand, the output $O_1$ of the microcomputer 110 includes lines for data, clock, and enable signals which set the output frequency of the synthesizer 104. The present invention may be used to control other radio circuits besides the frequency synthesizer 104. Thus, any radio circuit that has a variable radio parameter or characteristics that can be set to one of a plurality of values, or a menu that can be set to one of a plurality of menu items for a particular radio function can be controlled by the present invention.

A force sensing resistor (FSR) 112, comprising the menu selector, and a pull-up fixed resistor 114 form a voltage divider input circuit 101 to an analog to digital (A/D) input port $I_1$ of the microcomputer 110. A sensitivity select switch 122 to switch in one or more fixed resistors 124 is controlled by the microcomputer 110 as more sensitivity is desired. Alternately, the fixed resistance (114) may also be implemented electronically such as by a codeplug ("softpot") value programmed or varied by the microcomputer 110 to alter the resistance for better sensitivity. Obviously, the present invention would also apply if the force sensing resistor (FSR) 112 was interchanged in position with the pull-up resistors 114 and 124.

An optional "step" FSR key 112' may be implemented by a similar FSR input circuit 105 using another force sensing resistor. The force sensing resistors 112 and 112' may be manufactured by Interlink Electronics, Inc., P.O. Box 40760, 535 East Montecito Street, Santa Barbara, Calif., 93103. The FSR menu selector 112 and step selector 112' may be mounted anywhere on the radio 100 and are preferably mounted on a side for single-hand operability. Likewise, the display 102 can be mounted anywhere for convenient viewing by a user of the radio 100, as on the top of the radio 100.

By definition, when force is applied to the force sensitive resistor 112 or 112', its resistance changes. Thus, various pressures will result in different input voltages to the A/D inputs $I_1$ and $I_2$ and, therefore, different digital interpretations by the microprocessor or microcomputer 110 will be taken or associated. The range of possible digital interpretations from the range of pressure applied are divided into enough segments to accommodate each possible feature, mode, or characteristic selection. Hence, the strength with which the FSR resistor 112 or 112' is pressed is translated into a selection of a particular menu or sub-menu item according to the A/D range interpreted by the microcomputer 110 as shown in the table of FIG. 2.

Referring to FIG. 2, a symbolic representation of the operating parameters or modes and corresponding displayable character sets are illustrated. The menu corresponds to several specific functions that may be represented by acronyms. The specific modes include functions such as call alert, private call, status phone, and zone/channel.

Physically, the menu is a block of sequential memory bytes which has been organized as entries. Each entry comprises a plurality of sequential bytes corresponds to an A/D range which appears in the first column of the menu. Thus, stored in each entry is the code or specific A/D range for that entry for a particular function and a code for the corresponding displayable character for that function. Preferably, the first byte or bytes in each entry contain the function code and the remaining byte or bytes contain the character set code. The corresponding displayable character sets for these functions or their acronyms appear in the second column of FIG. 2.

In operation, the microcomputer 110 selects one of the entries ("zone/channel" for example) in the menu, or sub-entries in the sub-menu, loads the selected sub-entry's characteristic code (frequency code for example) or the entry's function into the radio circuits 103 (the synthesizer 104 for example) and then displays the corresponding character set in the display 102.

Figure 3:
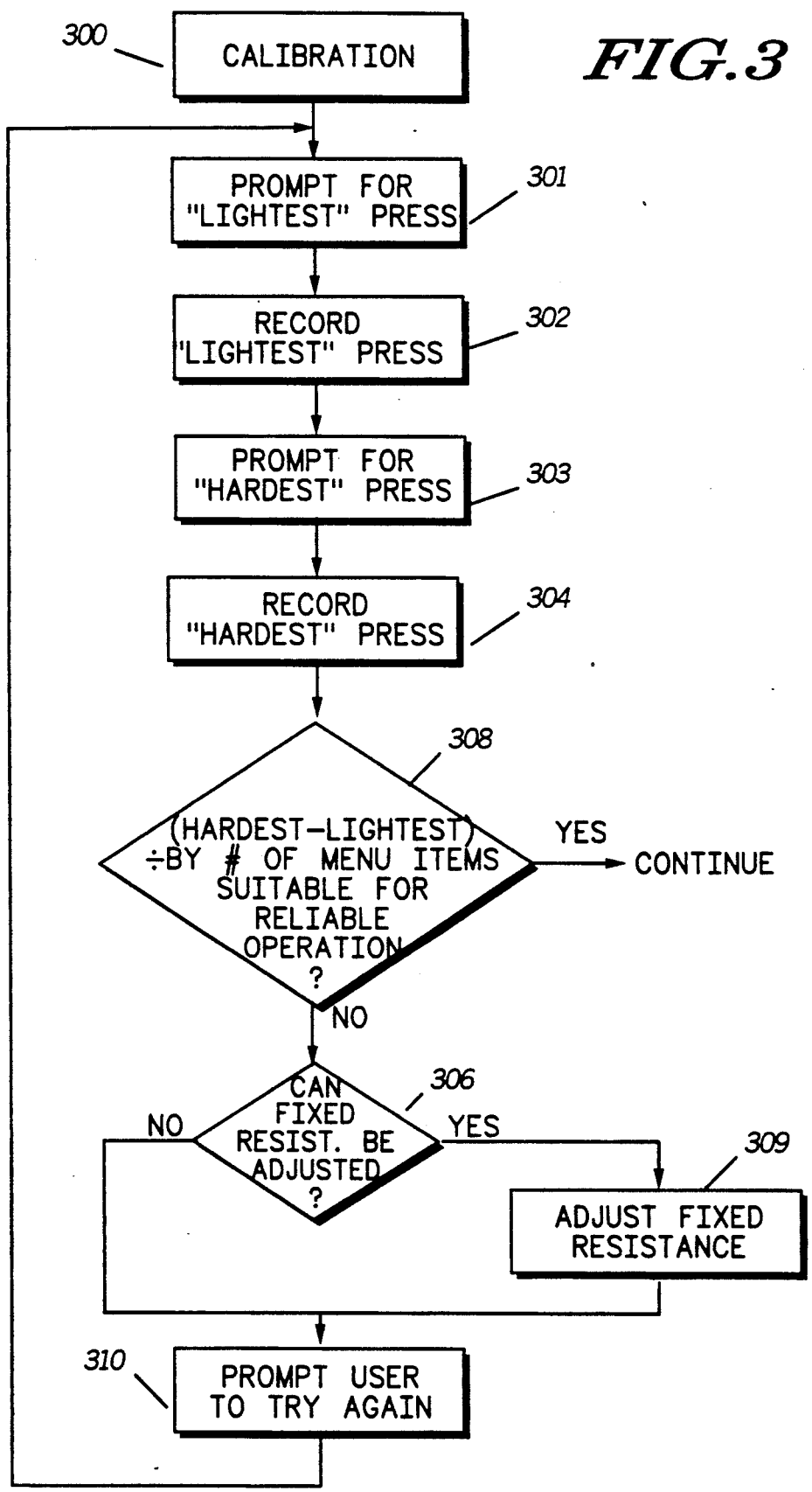
FIG. 3 is a flow diagram of the calibration software embodied in the microcomputer of FIG. 1.

Referring to FIG. 3, a calibration or scaling routine 300 inside the microcomputer 110 is shown. The sensitivity of the operation of the FSR 112 and 112' can be adapted to the ability of each individual radio user to apply pressure to the FSR 112 or 112'. In steps 301-304, the display 102 prompts the user and records the user's "lightest press" and "hardest press". These recorded values will be used as the lower and upper limits for dividing the total operating pressure or force range into segments or sub-range for each feature or mode as in the table of FIG. 2 to calibrate the FSR 112, each characteristic value of each function to calibrate the FSR 112 or FSR 112', and/or the direction of scrolling to calibrate the FSR 112'.

A decision block 308 determines whether the range of presses can be segmented into the desired number of menu items, sub-menu items, or directions for reliable operation. If "yes", the routine continues to the main portion of the software program. If there is not a sufficient range between the user's "lightest" and "hardest" presses to reliably select each possible function, characteristic, or scrolling direction, then a decision block 306 determines whether the pull-up or fixed resistance (114) can be further adjusted (by switching in or out resistor(s) 124 or controlling a "softpot" as the pull-up resistor 114) to provide increased sensitivity. If "yes", the resistance is adjusted by the next increment in step 309. Whether the fixed resistance could be adjusted or not, the user must be prompted to try again in step 310, and the calibration sequence restarts at step 301.

Figure 4:
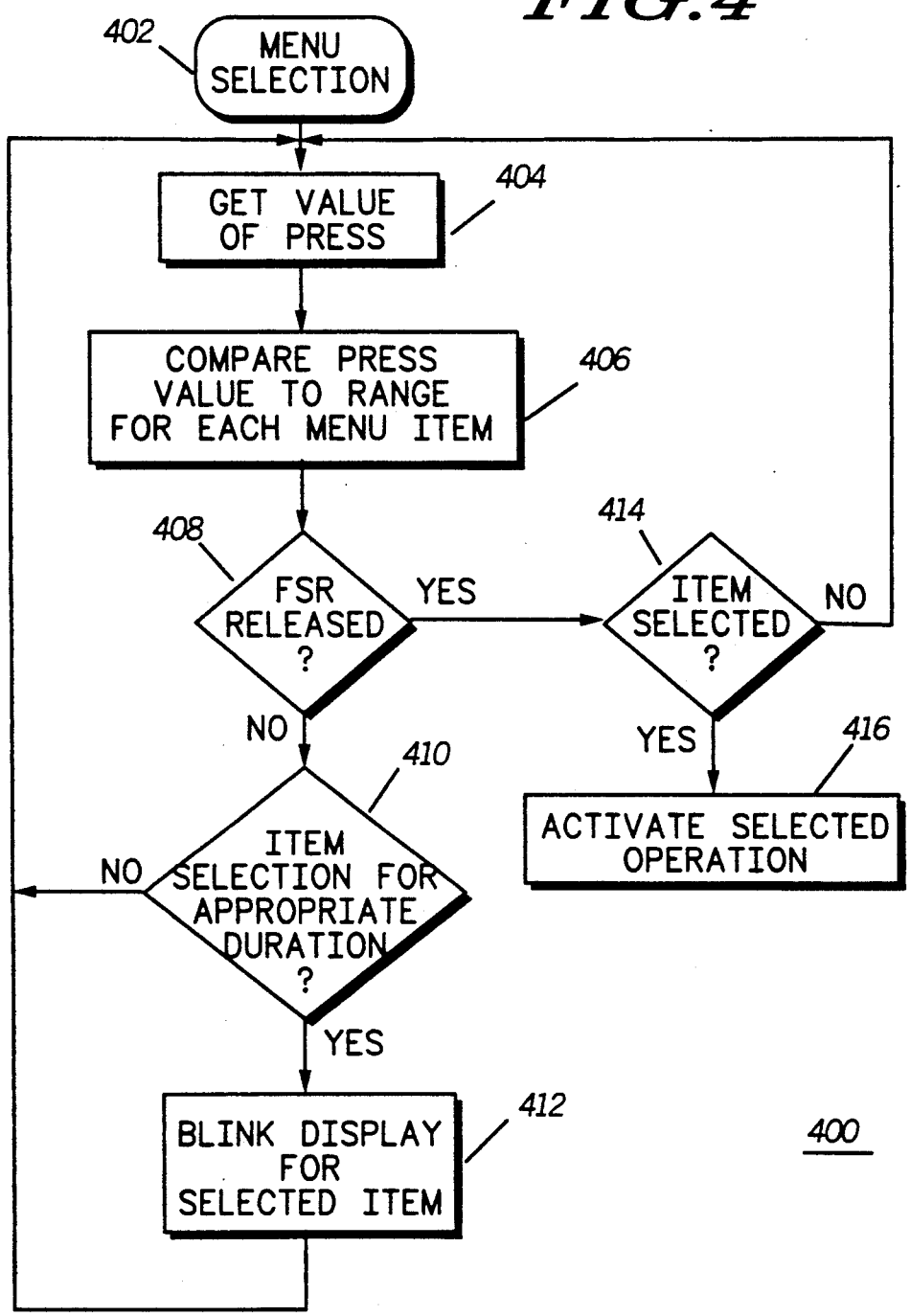
FIG. 4 is a flow diagram detailing the selection operation of the microcomputer of FIG. 1.

Referring to FIG. 4, a flow diagram detailing the operation of the microcomputer 110 described in conjunction with FIG. 1, is illustrated and is embodied with a routine which preferably resides in the internal memory 116. After the individual user's presses have been calibrated by the software operation of FIG. 3, the menu selection routine 400 that controls the selection of the menu entries or their characterizations or values after the menu item has been selected, can be initiated. The microprocessor 110 interprets the key presses generated by the "menu" key FSR 112 or the "step" key FSR 112' and routes these commands to the radio circuits 103 of FIG. 1 and to the display 102.

The menu selection routine 400 starts at the entry point 402 after the menu key FSR 112 has been pressed. The value of the press is recorded in step 404 and compared to the segmented ranges for each menu item of FIG. 2 in step 406. During menu item selection, feedback is provided to the user through the radio display 102 since when pressure is applied to the FSR 112, the display or enunciators of the display 102 will indicate the menu item corresponding to the amount of pressure applied per the table of FIG. 2. Thus, also in step 406, the display 102 is updated by loading the character set from the particular entry in the menu currently selected. Upon this feedback or acknowledgement by the display 102, the user may or may not decide to release the FSR 112. By trial and error initially or later with a developed sense of feel, the user eventually or quickly reaches the desired menu item by applying the right amount of force.

The user will not release the FSR 112 until the desired menu item is blinking on the display 102. Therefore, a decision block 408 determines whether the FSR 112 has been released. When the user finally reaches the menu item to be selected, the pressure is held relatively constant within that A/D range until the display/announciator 102 flashes. At this time, the user has to maintain the pressure within the range for that menu item for an appropriate duration as determined by a decision block 410. If indeed that is the menu item desired and that pressure range was maintained sufficiently, the display (102) of that selected item will be blinking in step 412. Either way, the routine returns to step 404 to traverse the routine as many times as needed to arrive at the desired menu item denoted by a blinking display of that selected item.

The decision block 414 will ensure that the selected item is indeed desired by returning to step 404 if the item is not blinking to begin the process again. Otherwise, that selected menu item is activated in step 416 after releasing the FSR resistor 112 as determined by the decision block 408. Thus, after the FSR 112 has been released after the feedback of the annunciator blinking of the character set corresponding to that particular function has been received, the microcomputer 110 directs the corresponding function code into the radio circuits 103 to activate that function.

Figure 5:
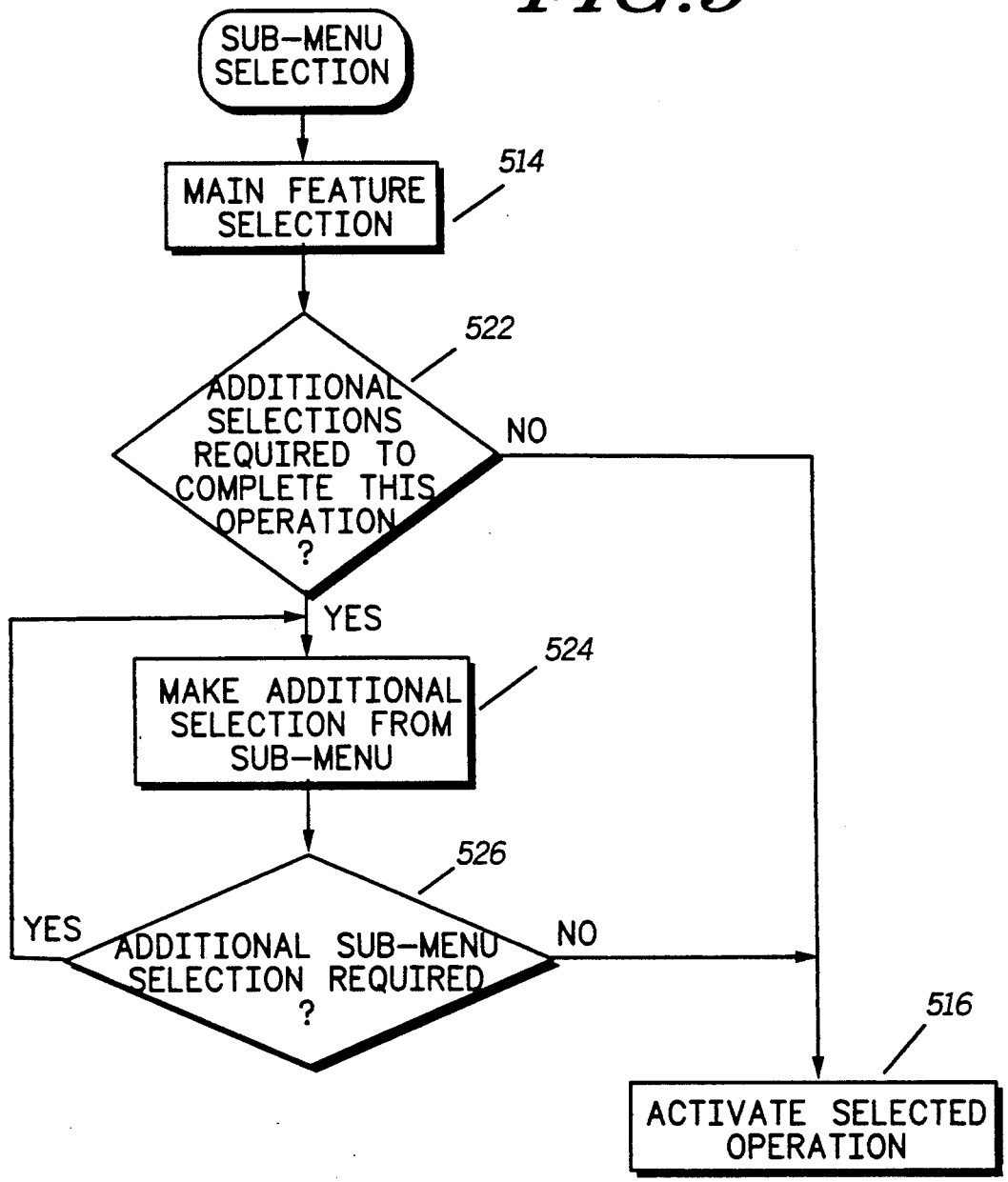
FIG. 5 is a flow diagram detailing the sub-menu selection operation of the microcomputer of FIG. 1.

Referring to FIG. 5, a sub-menu selection routine of the microcomputer 110 is illustrated. Once the desired function is selected and acknowledged by the blinking feedback of the display 102 in step 514, then the characteristic of that function or parameter value could be selected in the same manner by the appropriate force and feedback acknowledgement of FIG. 3 if additional sub-menu selections are required to complete the selected operation as determined by the microcomputer 110 in step 522. The same menu key FSR 112 may now be used as a step key to select (524) a specific value within the selected function by moving through the various characteristics or parameter values of the selected function by the amount of pressure detected by the microcomputer 110. If additional sub-menu selections are required as determined by the decision block 526, the routine returns to step 524 to make all the necessary sub-selections before activating the selected operation in step 516 (by releasing the FSR 112 after the selected sub-menu characteristic has been blinking as in FIG. 4). It is to be appreciated that each sub-menu requires its own A/D "mapping" constructed in the same manner as the example in FIG. 2. Hence, the present invention eliminates a unique control per function and, therefore, saves "real estate" area.

Alternately, the characteristic or value of that function could also be incremented or decremented by depressing the optional additional "step" FSR key 112'. Hence, there would be optionally two special purpose keys: the menu key FSR 112 and the step key FSR 112'. The menu key FSR 112 is used to select the desired function or mode while the step key FSR 112' is optionally used to cause the microcomputer 110 to indicate on the display 102 whether an "up" or "down" scrolling of the sub-men entries is desired based on the pressure applied. Similar to the menu segmentation described previously, the direction and activation of scrolling is thus initiated by applying the appropriate force on the FSR 112'. Applying force within one range causes scrolling in one direction while applying force of another range causes scrolling in the opposite direction. Once the desired direction of scrolling is blinking on the display 102, the step FSR 112' may be released while the menu FSR 112 or the FSR 112' may be re-pressed as before to apply the appropriate force or pressure to reach the desired characteristic of the function.

Thus, FIG. 2 would now be a symbolic representation of the sub-menu of characteristics such as frequencies and corresponding displayable character sets if the menu item of the "zone/channel" function was originally selected. The microcomputer 110 selects one of the entries in the sub-menu based on the pressure applied on the FSR 112, loads the selected entry's frequency code into the synthesizer 104 and then displays the corresponding character set in the display 102.

As indicated by the different menu functions, the present invention can be used to control other circuits in the radio besides the frequency synthesizer 104. In this event, other parameter values besides frequency codes would be stored in each entry of the sub-menu.

For example, the present invention could be used to select one of a plurality of identification codes (IDs) for the selected function "call alert" or phone numbers for the selected function of "phone" among other radio options. In addition, some selections may result in interprocessor communications.

In summary, a selection of menu or sub-menu items is based on the pressure applied to, at a minimum, one single actuator or pressure sensing resistor FSR. Before the user first operates the radio in this manner, the FSR A/D voltage range is scaled according to the user's physical capabilities of applying pressure such that the range of FSR circuit's A/D voltage range can be divided into suitable segments (including a threshold minimum for "no selection"). To select a particular operating function, or characteristic of the function from the menu or the sub-menu, respectively, the user can scroll the microcomputer 110 across the menu or sub-menu quickly by applying the appropriate corresponding force and stopping at the desired entry by maintaining that force for a sufficient amount of time.

What is claimed is:

1. A method of menu selection, comprising the steps of:

calibrating a range of forces applied by a user on a force sensitive resistor selector key to a selective range of forces required for selecting a plurality of menu items; and associating a selective subset from said range of forces by said user to each selection of a menu item.

2. A menu selector, comprising:

processing means having an analog to digital (A/D) input and an output for driving a display menu; and a voltage divider having at least one force sensitive resistor for providing a variable voltage to said A/D input for selecting an item of said menu.

3. A function key entry system for use with a communication device, comprising:

a radio circuit having a variable function, wherein said variable function can be set to one of a plurality of parameters;

storing means for storing a menu of predetermined function parameters, each of said predetermined function parameters having a corresponding character set;

selecting means for selecting one of said predetermined function parameters from said menu;

said selecting means including a force sensing resistor key for providing a particular voltage according to a selected force applied thereon;

display means for displaying the character set corresponding to the selected one of said predetermined function parameters; and controller means coupled to said force sensing resistor key and said display means for decoding said particular voltage corresponding to said selected force to select one of said predetermined function parameters, and the character set corresponding to the selected one of said function parameters is displayed on said display means.

4. The function key entry system of claim 3 wherein said selected function parameter can be set to one of a plurality of parameter values.

5. The function key entry system of claim 3 wherein said controller means activates said selected function parameter after decoding said particular voltage corresponding to said selected force applied for a sufficient amount of time to select one of said predetermined function parameters, and the character set corresponding to the selected one of said function parameters is blinking on said display means.

6. The function key entry system of claim 4 wherein said controller means provides said set parameter value after decoding said particular voltage corresponding to said selected force applied for a sufficient amount of time to select one of said predetermined parameter values, and the character set corresponding to the selected one of said parameter values is blinking on said display means.

7. The function key entry system of claim 3 further comprising:

means for scaling a range of forces applied by a user on said force sensing resistor key to a selective total range of forces required for selecting a plurality of said menu of predetermined function parameters.

8. The function key entry system of claim 3 wherein said storing means stores and segments said menu of predetermined function parameters according to a plurality of voltage range segments, each of said predetermined function parameters having said corresponding character set and a corresponding voltage range segment.

9. The function key entry system of claim 7 wherein said storing means stores and segments said selective total range of forces required for selecting said plurality of said menu of predetermined function parameters into a plurality of voltage sub-range segments, each of said predetermined function parameters having said corresponding character set and a corresponding voltage sub-range segment.

* * * * *